US012782389B2

(12) United States Patent
Lin et al.

(10) Patent No.: US 12,782,389 B2
(45) Date of Patent: Nov. 3, 2026

(54) TEST FIXTURE

(71) Applicant: KINSUS INTERCONNECT TECHNOLOGY CORP., Taoyuan City (TW)

(72) Inventors: Ting-Hao Lin, Taoyuan City (TW); Chiao-Cheng Chang, Taoyuan City (TW); Chien-Wei Chang, Taoyuan City (TW)

(73) Assignee: KINSUS INTERCONNECT TECHNOLOGY CORP., Taoyuan City (TW)

( * ) Notice: Subject to any disclaimer, the term of this patent is extended or adjusted under 35 U.S.C. 154(b) by 213 days.

(21) Appl. No.: 18/794,152

(22) Filed: Aug. 5, 2024

(65) Prior Publication Data

US 2025/0389754 A1 Dec. 25, 2025

(30) Foreign Application Priority Data

Jun. 20, 2024 (TW) ................................ 113122992

(51) Int. Cl.
*G01R 1/073* (2006.01)
*G01R 1/067* (2006.01)

(52) U.S. Cl.
CPC ..... *G01R 1/07314* (2013.01); *G01R 1/06761* (2013.01)

(58) Field of Classification Search
CPC ........................ G01R 1/07314; G01R 1/06761
USPC ..................................................... 324/754.18
See application file for complete search history.

(56) References Cited

U.S. PATENT DOCUMENTS

| | | | | | |
|---|---|---|---|---|---|
| 5,792,594 | A * | 8/1998 | Brown | G03F 7/0035 430/394 |
| 7,415,761 | B2 * | 8/2008 | Hirose | B23K 26/389 430/318 |
| 2006/0033214 | A1 * | 2/2006 | Tomono | H05K 3/3436 257/772 |
| 2009/0072849 | A1 * | 3/2009 | Dickson | G01R 1/07371 324/763.01 |
| 2009/0078451 | A1 * | 3/2009 | Niki | H05K 3/4682 174/250 |
| 2011/0148448 | A1 * | 6/2011 | St. Onge | G01R 31/31905 702/85 |
| 2011/0284277 | A1 * | 11/2011 | Kato | H05K 1/113 174/258 |
| 2014/0091821 | A1 * | 4/2014 | Shia | G01R 1/06761 324/754.03 |

(Continued)

*Primary Examiner* — Christopher P McAndrew
(74) *Attorney, Agent, or Firm* — Juan Carlos A. Marquez; Marquez IP Law Office, PLLC

(57) ABSTRACT

A test fixture includes a probe layer, a first resin layer, a first circuit layer, a second resin layer, a second circuit layer, a solder mask layer, and a bonding pad layer. The probe layer includes probes. The first resin layer is on the probe layer. The first circuit layer is on the first resin layer and connected to the probe layer. The second resin layer is on the first circuit layer. The second circuit layer is on the second resin layer and electrically connected to the first circuit layer. The solder mask layer is on the second circuit layer and the second resin layer and has bonding pad openings. The bonding pad layer includes bonding pads in the bonding pad openings and is electrically connected to the second circuit layer. A first pitch between the bonding pads is greater than a second pitch between the probes.

7 Claims, 8 Drawing Sheets

(56) References Cited

U.S. PATENT DOCUMENTS

| | | | | |
|---|---|---|---|---|
| 2014/0266568 | A1* | 9/2014 | Cheng | G01R 1/203 338/314 |
| 2018/0053750 | A1* | 2/2018 | Kim | H10W 90/00 |
| 2020/0166543 | A1* | 5/2020 | Lee | G01R 31/2831 |
| 2021/0398865 | A1* | 12/2021 | Lin | H10H 20/8506 |
| 2023/0130078 | A1* | 4/2023 | Yu | G01R 31/2889 361/760 |
| 2023/0358786 | A1* | 11/2023 | Chen | G01R 1/07371 |
| 2024/0103040 | A1* | 3/2024 | Frodis | G01R 1/06716 |

* cited by examiner

TEST FIXTURE

CROSS-REFERENCE TO RELATED APPLICATION

This non-provisional application claims priority under 35 U.S.C. § 119(a) to patent application No. 113122992 filed in Taiwan, R.O.C. on Jun. 20, 2024, the entire contents of which are hereby incorporated by reference.

BACKGROUND

Technical Field

The instant disclosure is related to the field of packaging and testing, especially to a test fixture.

Related Art

Along with the developments of semiconductor industries and the size reduction of circuit patterns, the development of test fixtures is getting more and more attentions. As to a test fixture known to the inventor, the probe is inserted into the probe plate, and a test board is further assembled on the probe plate to form the test fixture. Along with the size reduction and pitch reduction of circuit pattens, the size of the probe is also reduced. However, in order to correspond to the openings on the probe plate, the probes cannot be inserted into the probe plate vertically; instead, the probes are inserted into the probe plate obliquely or the probes are configured as bent structures.

SUMMARY

However, for probes with obliquely-inserted or bent configurations, when an assembling tolerance occurs, the probe will not contact the wafter, or the probe will scratch the wafer because the excessive length of the probe. Consequently, the arrangement density of the probes has limitations.

The inventors tried to configure metal bumps as probes by using circuit manufacturing processes, in which through image transfer techniques, the metal bumps are defined by photoresist firstly and then are manufactured using high-speed electroplating. It is realized that, in order to form bumps with identical height by using high-speed electroplating, a polishing technique will be applied. However, when the polishing technique is applied to a thin substrate, the substrate will be squeezed and thus become skewed. As a result, the thickness of the substrate is also limited if the polishing technique is to be applied.

To address these issues, a test fixture is provided. In some embodiments, the test fixture comprises a probe layer, a first resin layer, a first circuit layer, a second resin layer, a second circuit layer, a solder mask layer, and a bonding pad layer. The probe layer comprises a plurality of probes. The probes are arranged equidistantly in a first direction and extend in a second direction. The first direction is substantially perpendicular to the second direction. Each of the probes comprises a copper core layer and an outer layer, and the outer layer encloses an outer surface of the copper core layer. The first resin layer is on the probe layer, the first resin layer has a plurality of first openings, and the first openings correspond to the probes. The first circuit layer is on at least one portion of the first resin layer and in the first openings, and the first circuit layer is connected to the probe layer. The second resin layer is on the first circuit layer and the first resin layer, and the second resin layer has a plurality of second openings. The second circuit layer is on at least one portion of the second resin layer and in the second openings, and the second circuit layer is electrically connected to the first circuit layer. The solder mask layer is on the second circuit layer and the second resin layer, and the solder mask layer has a plurality of bonding pad openings. The bonding pad layer comprises a plurality of bonding pads, the bonding pads are in the bonding pad openings and protrude out of the solder mask layer, and the bonding pad layer is electrically connected to the second circuit layer. A first pitch between the bonding pads is greater than a second pitch between the probes.

In some embodiments, the test fixture comprises a third resin layer and a redistribution circuit layer. The third resin layer is on the second circuit layer and the second resin layer and has a plurality of third openings. The redistribution circuit layer is on at least one portion of the third resin layer and in the third openings, and the redistribution circuit layer is connected to the second circuit layer and the bonding pad layer.

More specifically, in some embodiments, a pitch between the third openings is not identical to a pitch between the second openings.

In some embodiments, a pitch between the first openings is not identical to a pitch between the second openings.

In some embodiments, a length of each of the probes is in a range between 0.03 mm and 0.5 mm.

In some embodiments, the first pitch is in a range between 0.3 mm and 10 mm.

In some embodiments, the second pitch is in a range between 0.1 mm and 1 mm.

In some embodiments, the outer layer comprises nickel.

In some embodiments, the outer layer further comprises tungsten or comprises tungsten-nickel alloy.

In some embodiments, each of the probes further comprises a connection base, the connection base is connected to the copper core layer and the first circuit layer, and an area of the connection base is greater than an area of the copper core layer.

According to one or some embodiments, by configuring the test fixture with a inverted structure, the probes can be provided with a uniform height and a same extending direction properly. Therefore, the issues caused by the probes with obliquely-inserted or bent configurations can be prevented. Moreover, the test fixture can be manufactured through mature circuit board manufacturing processes, so that the product yield of the test fixture can be increased and the manufacturing cost of the test fixture can be reduced.

BRIEF DESCRIPTION OF THE DRAWINGS

The disclosure will become more fully understood from the detailed description given herein below for illustration only, and thus not limitative of the disclosure, wherein.

DETAILED DESCRIPTION

It should be understood that, when an element is referred to as being "disposed on" or "connected to" another element, the element may be directly on the another element, or one or more intervening elements may be present so that the element is connected to the another element through the one or more intervening elements. On the contrary, when an element is referred to as being "directly disposed on/directly connected on" or "directly disposed to/directly connected to" another element, it can be clearly understood that there are no intervening elements between the two elements.

Furthermore, in the following descriptions, it will be understood that, although the terms "first," "second," "third," etc. may be used herein to describe various elements, components, regions, layers, or portions, these terms are only used to distinguish these elements, components, regions, layers, or sections, rather than being used to represent the definite order of these elements, components, regions, layers, or portions. Moreover, it will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" or "over" the other elements or features. In other words, these terms only represent a relative position relationship between the described components, not an absolute position relationship between the described components.

Figure 1:
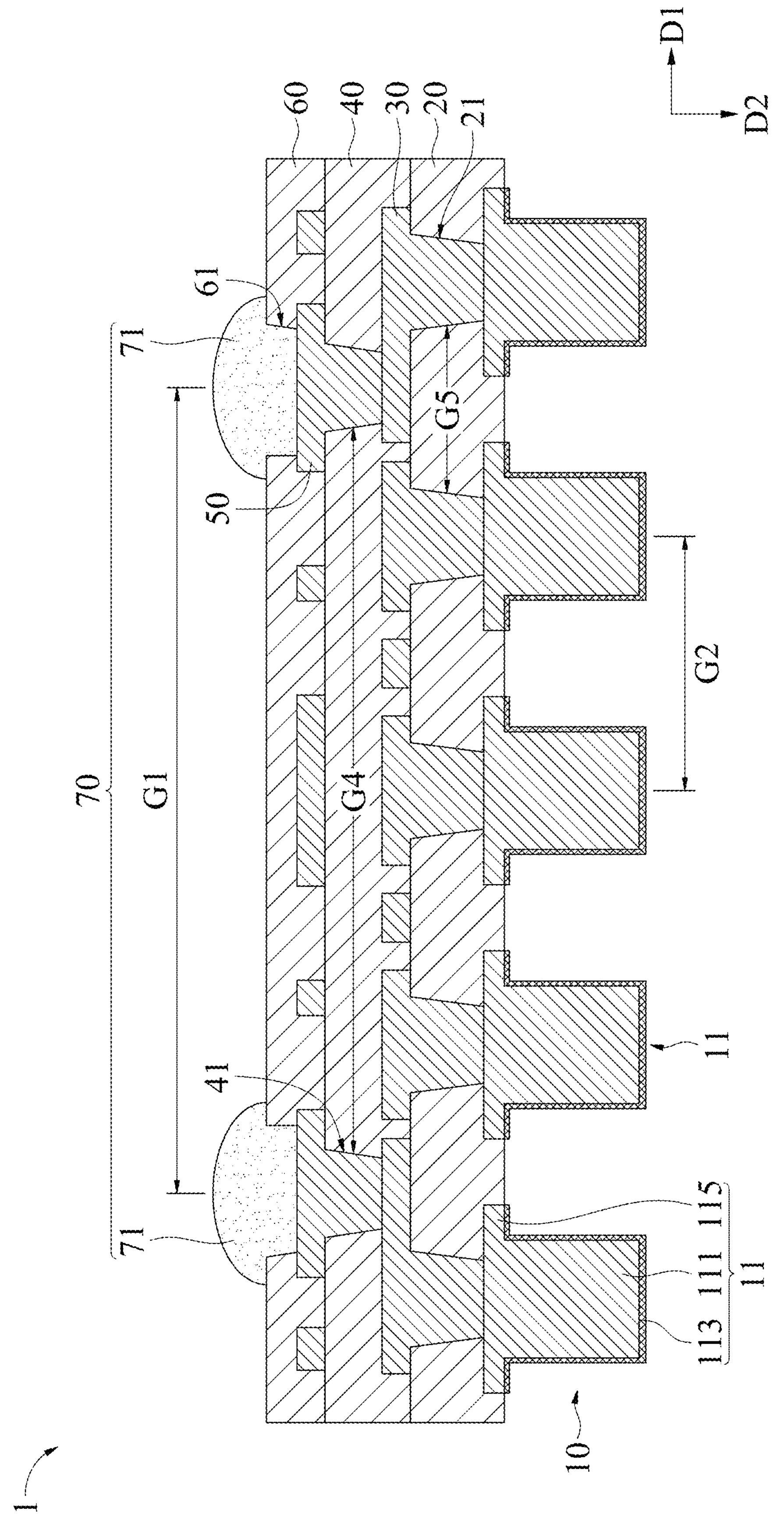
FIG. 1 illustrates a cross-sectional view of a test fixture according to a first embodiment of the instant disclosure.

FIG. 1 illustrates a cross-sectional view of a test fixture according to a first embodiment of the instant disclosure. As shown in FIG. 1, in some embodiments, the test fixture 1 comprises a probe layer 10, a first resin layer 20, a first circuit layer 30, a second resin layer 40, a second circuit layer 50, a solder mask layer 60, and a bonding pad layer 70. The probe layer 10 comprises a plurality of probes 11. The probes 11 are arranged equidistantly in a first direction D1 and extend in a second direction D2. The first direction D1 is substantially perpendicular to the second direction D2. Each of the probes 11 comprises a copper core layer 111 and a outer layer 113, and the outer layer 113 encloses an outer surface of the copper core layer 111 to enhance the mechanical property of the probe 11.

The first resin layer 20 is on the probe layer 10 and has a plurality of first openings 21, and each of the first openings 21 correspond to a corresponding one of the probes 11. The first circuit layer 30 is on at least one portion of the first resin layer 20 and in the first openings 21, and the first circuit layer 30 is connected to the probe layer 10. The second resin layer 40 is on the first circuit layer 30 and the first resin layer 20, and the second resin layer 40 has a plurality of second openings 41. The second circuit layer 50 is on at least one portion of the second resin layer 40 and in the second openings 41, and the second circuit layer 50 is electrically connected to the first circuit layer 30.

The solder mask layer 60 is on the second circuit layer 50 and the second resin layer 40, and the solder mask layer 60 has a plurality of bonding pad openings 61. The bonding pad layer 70 comprises a plurality of bonding pads 71, the bonding pads 71 are in the bonding pad openings 61 and protrude out of the solder mask layer 60, and the bonding pad layer 70 is electrically connected to the second circuit layer 50. A first pitch G1 between the bonding pads 11 is greater than a second pitch G2 between the probes 11. In other words, according to one or some embodiments, the test fixture 1 is configured as a inverted structure, so that the probe 11 is configured as a bump structure and the extension direction of the probe 11 can correspond to the component to be tested. Therefore, longer probes which correspond to the probe card are not necessarily needed to be manufactured, and thus the issues caused by the probes with obliquely-inserted or bent configurations can be prevented.

Figure 2:
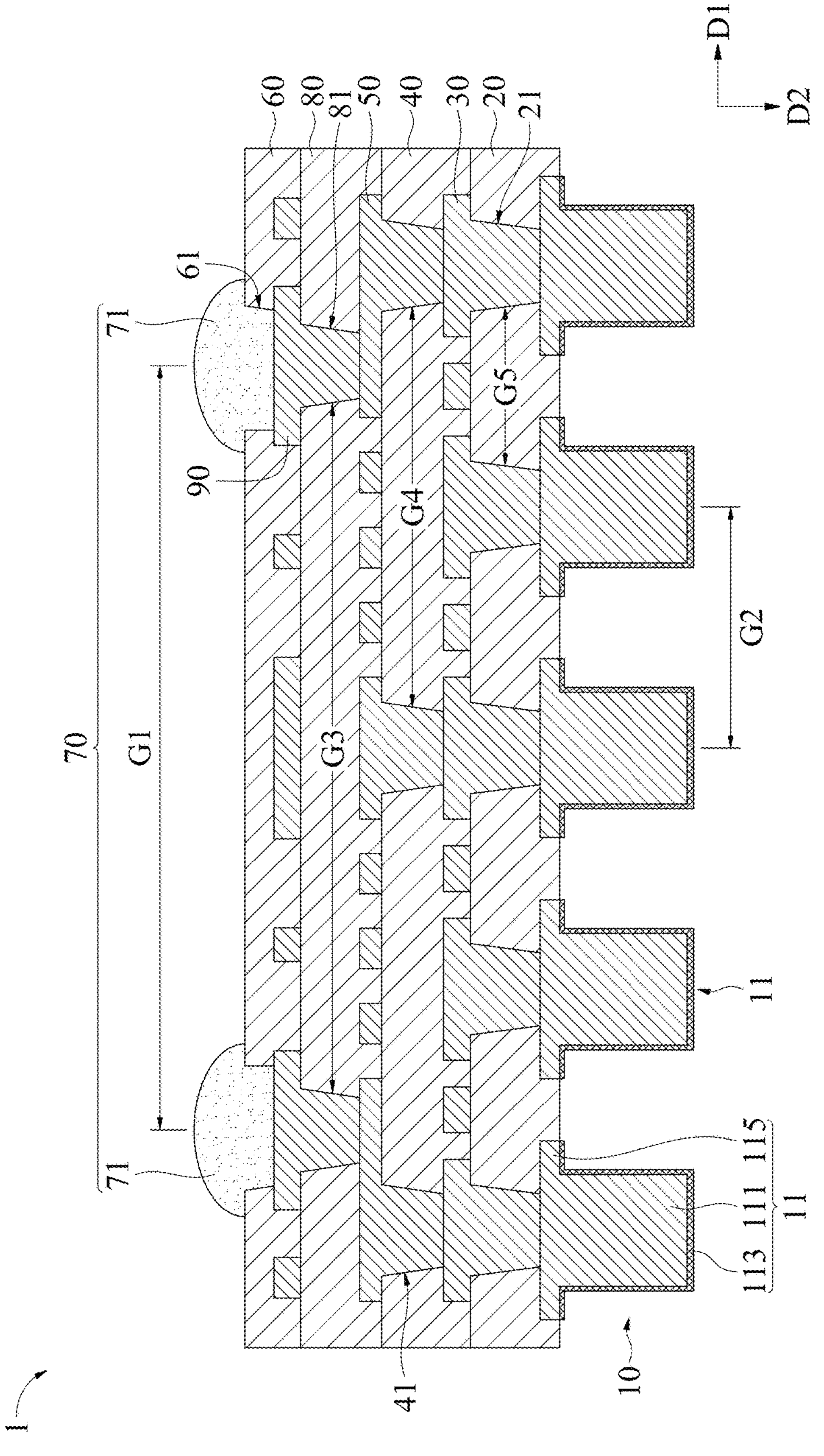
FIG. 2 illustrates a cross-sectional view of a test fixture according to a second embodiment of the instant disclosure.

FIG. 2 illustrates a cross-sectional view of a test fixture according to a second embodiment of the instant disclosure. As shown in FIG. 2, in this embodiment, the test fixture 1 further comprises a third resin layer 80 and a redistribution circuit layer 90. The third resin layer 80 is on the second circuit layer 50 and the second resin layer 40, and the third resin layer has a plurality of third openings 81. The redistribution circuit layer 90 is on at least one portion of the third resin layer 80 and in the third openings 81, and the redistribution circuit layer is electrically connected to the second circuit layer 50 and the bonding pad layer 70. The embodiment shown in FIG. 2 is provided for illustrative purposes, not limitations to the instant disclosure; in some embodiments, the test fixture 1 may further comprise a plurality of the third resin layers 80 and a plurality of the redistribution circuit layers 90. According to some embodiments, through the configuration of the redistribution circuit layer 90, the first pitch G1 between the bonding pads 71 of the test fixture 1 can be adjusted to correspond to the contacts of a test board (not shown) to be assembled on the test fixture 1. In some embodiments, a third pitch G3 between the third openings 81 is not identical to a fourth pitch G4 between the second openings 41. Furthermore, in some embodiments, a fifth pitch G5 between the first openings 21 is not identical to the fourth pitch G4 between the second openings 41.

More specifically, in some embodiments, a length of each of the probes 11 is in a range between 0.03 mm and 0.5 mm, preferably in some embodiments, the length of each of the probes 11 is in a range between 0.05 mm and 0.2 mm. However, it is understood that, the embodiments are provided for illustrative purposes, not limitations to the instant disclosure.

In some embodiments, the first pitch G1 is in a range between 0.3 mm and 10 mm, preferably in some embodiments, the first pitch G1 is in a range between 0.5 mm and 5 mm. In some embodiments, the second pitch G2 is in a range between 0.1 mm and 1 mm, preferably in some embodiments, the second pitch G2 is in a range between 0.3 mm and 0.6 mm.

In some embodiments, the outer layer 113 comprises nickel. More specifically, in some embodiments, the outer layer 113 further comprises tungsten or comprises tungsten-nickel alloy. Accordingly, in some embodiments, through nickel, tungsten, or nickel-tungsten alloy, the mechanical strength of the copper core layer 111 can be enhanced.

In some embodiments, the probe 11 further comprises a connection base 115, the connection base 115 is connected to the copper core layer 111 and the first circuit layer 30, and an area of the connection base 115 is greater than an area of the copper core layer 111.

Figure 3A:
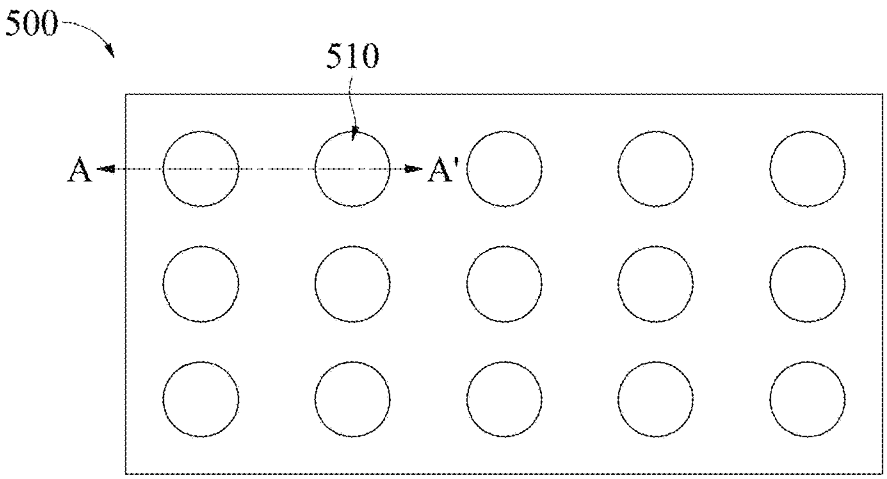
FIG. 3A illustrates a top view of one of the manufacturing steps of the test fixture according to the second embodiment of the instant disclosure.
Figure 3B:
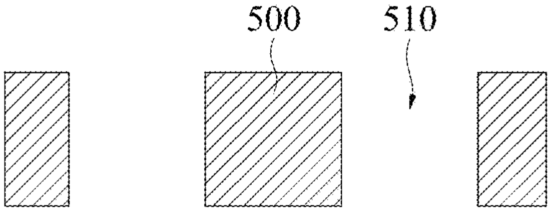
FIG. 3B to FIG. 3O illustrate cross-sectional views of the manufacturing steps of the test fixture according to the second embodiment of the instant disclosure.

FIG. 3A illustrates a top view of one of the manufacturing steps of the test fixture according to the second embodiment of the instant disclosure. FIG. 3B to FIG. 3O illustrate cross-sectional views of the manufacturing steps of the test fixture according to the second embodiment of the instant disclosure. In FIG. 3B to FIG. 3O, the cross-sectional structure of the test fixture of the second embodiment along line A-A' shown in FIG. 3A is applied to describe the steps of the manufacturing process for the test fixture; however, it is understood that, the embodiments are provided for illustrative purposes, not limitations to the instant disclosure. As shown in FIG. 3A and FIG. 3B and also shown in FIG. 2, firstly, a metal plate 500 is prepared, and holes 510 are opened on the metal board 500. The hole diameter and the positions of the holes 510 and the thickness of the metal board 500 (the depth of the holes 510) correspond to the specification of the probes 11. In this embodiment, the metal board 500 may be a copper plate.

Figure 3C:
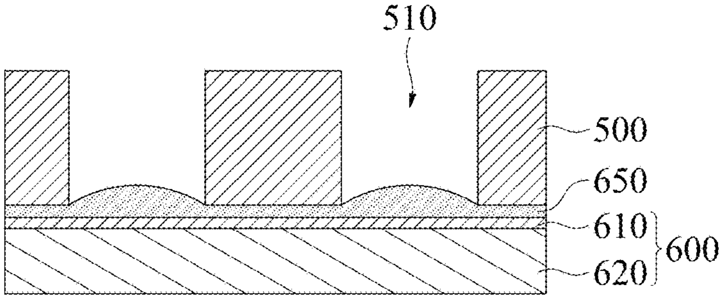
Figure 3D:
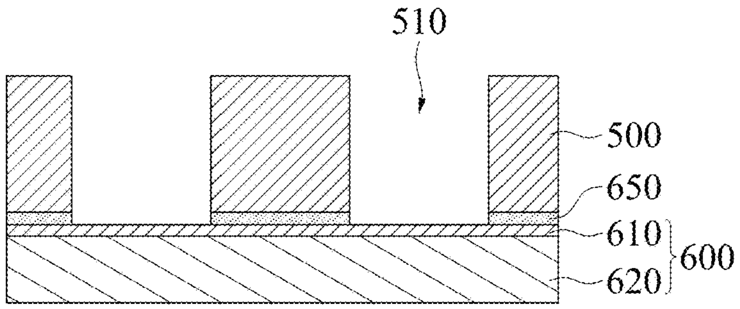
Figure 3E:
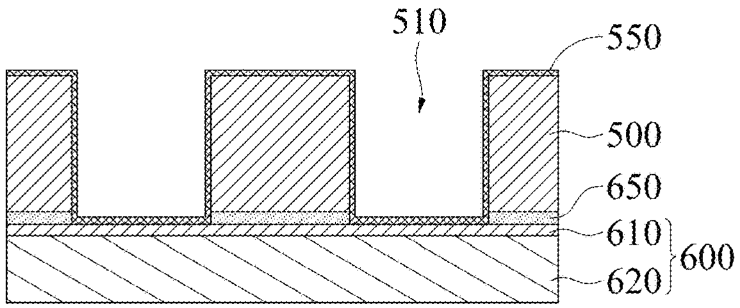

Next, as shown in FIG. 3C, a supporting plate 600 is adhered to one side of the metal plate 500, the supporting plate 600 comprises a copper foil layer 610 and a supporting layer 620, and the copper foil layer 610 is adhered to the metal plate 500 through an adhesive 650. As shown in FIG. 3D and FIG. 3E, after the adhesive 650 in the holes 510 is removed, a stopping layer 550 is plated on the surface of the metal plate 500, and the stopping layer 550 is further plated on the bottom surface and the wall surface of the holes 510. In this embodiment, the stopping layer 550 may be made of nickel, tungsten, or nickel-tungsten alloy.

Figure 3F:
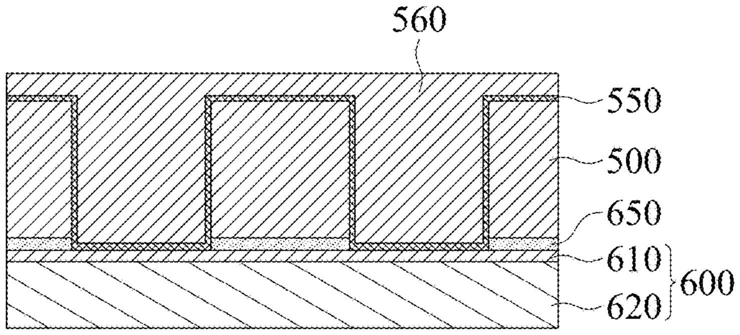
Figure 3G:
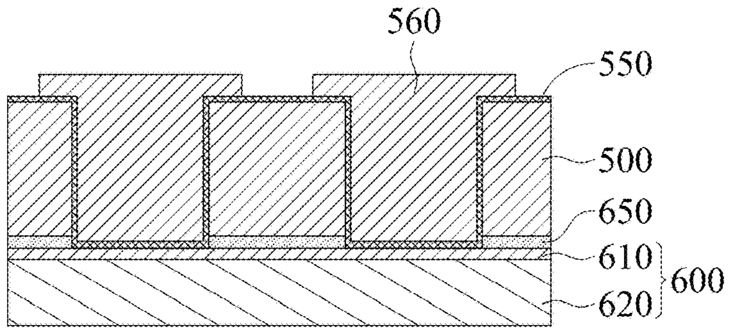
Figure 3H:
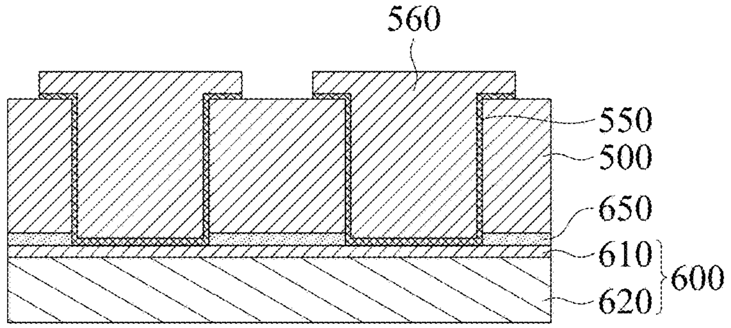

As shown in FIG. 3F and FIG. 3G, through electroplating or chemical plating, a copper layer 560 is formed on the metal layer 500 and is filled into the holes 510. Next, through image transfer techniques, parts of the copper layer 560 is removed. Then, as shown in FIG. 3H, the portion of the stopping layer 550 below the copper layer 560 which is removed is removed.

Figure 3I:
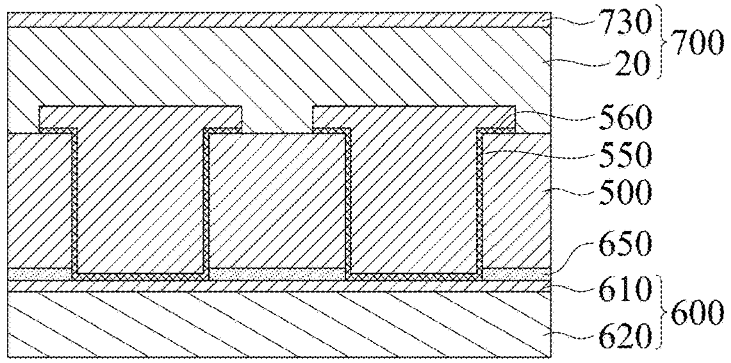
Figure 3J:
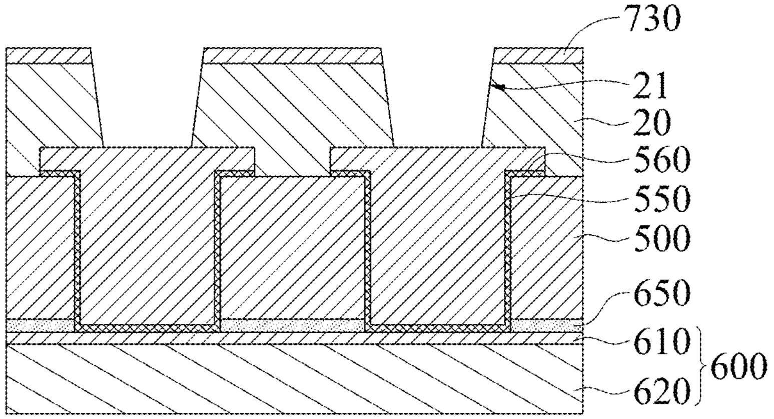
Figure 3K:
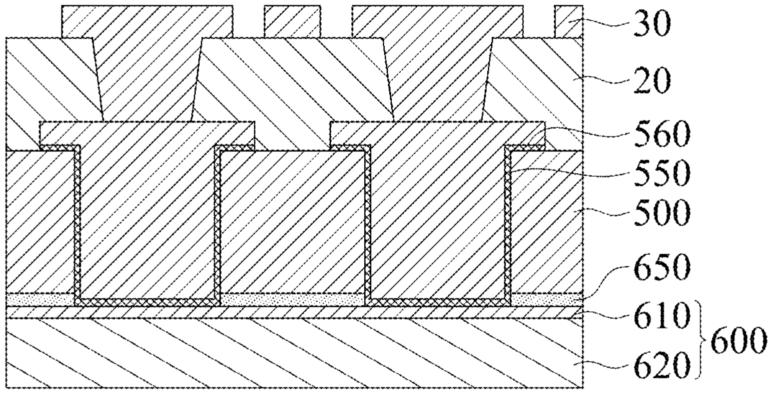
Figure 3L:
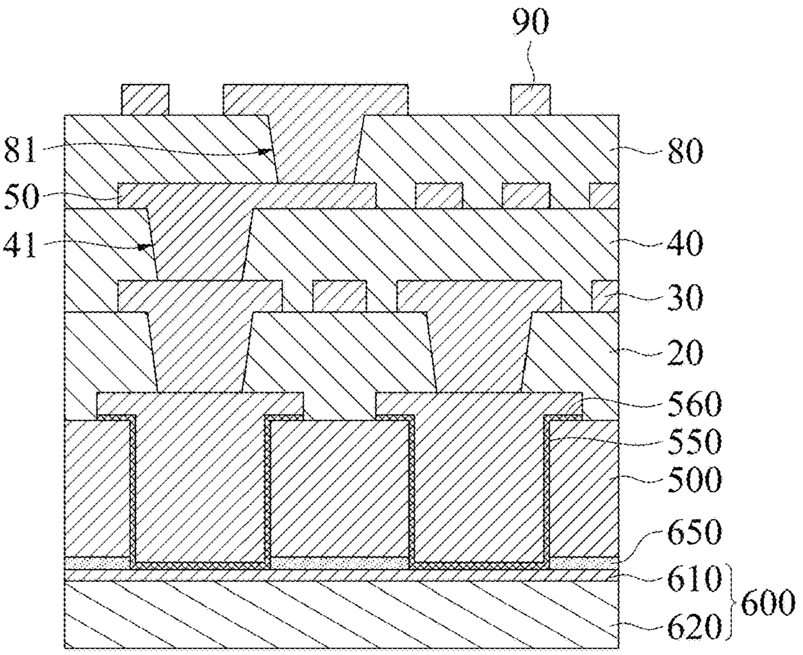
Figure 3M:
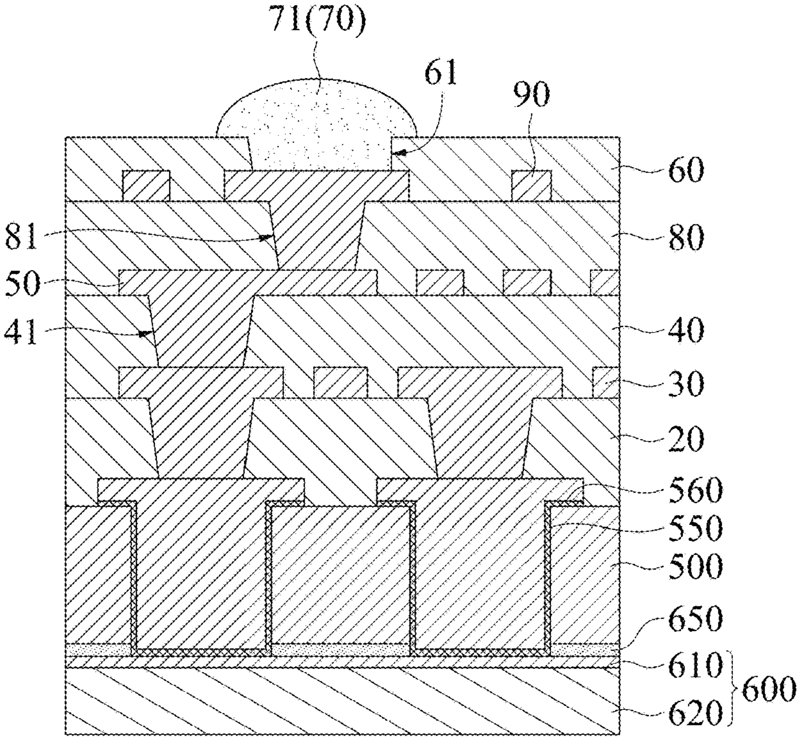

As shown in FIG. 3I, the build-up structure 700 is laminated on the metal plate 500, and the build-up structure 700 comprises a resin layer (the first resin layer 20) and a copper foil layer 730. The build-up structure 700 is laminated on the surface of the metal plate 500. Further, as shown in FIG. 3J and FIG. 3K, a plurality of first openings 21 is opened on the build-up structure 700, and the first circuit layer 30 is formed using electroplating and image transfer techniques, so that the copper foil layer 730 forms a portion of the first circuit layer 30. Next, as shown in FIG. 3L, the build-up procedure is repeated to form the second resin layer 40, the second circuit layer 50, the third resin layer 80, and the redistribution circuit layer 90. Further, as shown in FIG. 3M, the solder mask layer 60 and the bonding pad layer 70 are formed.

Figure 3N:
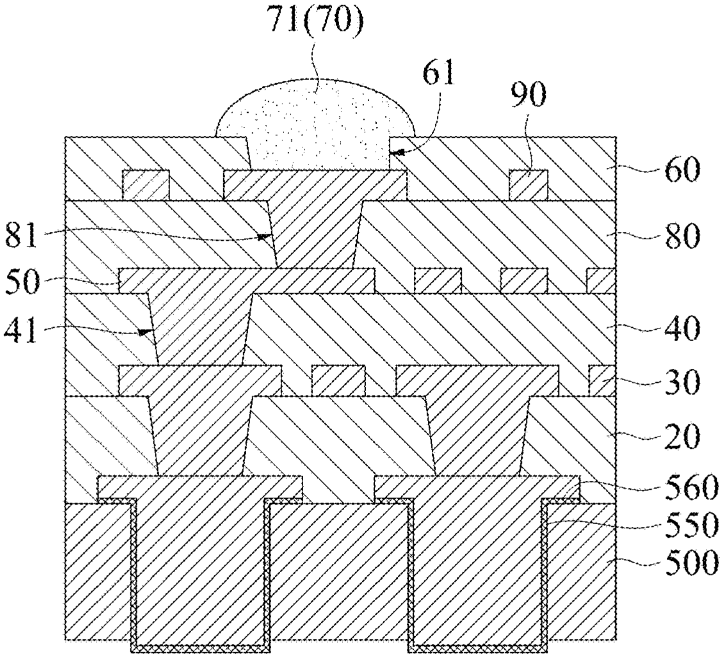
Figure 3O:
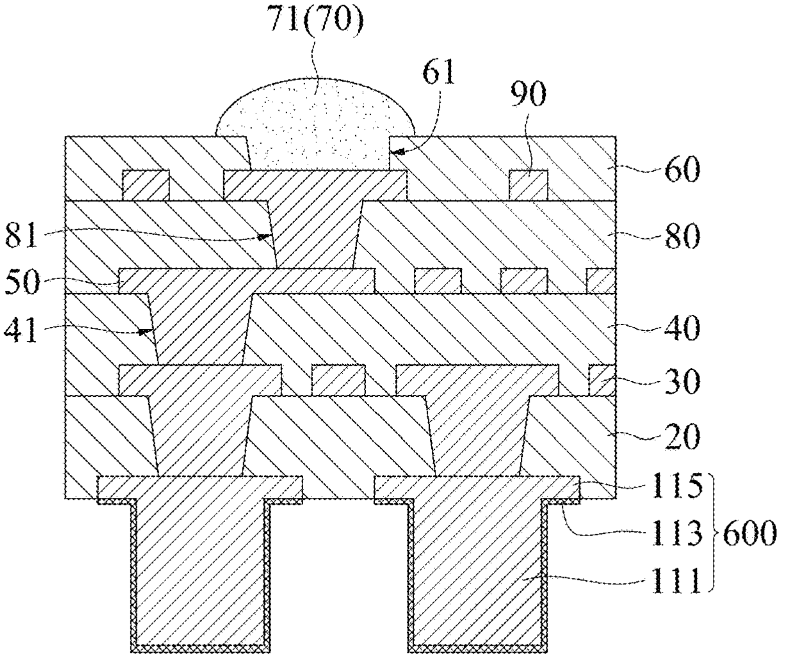

As shown in FIG. 3N, the supporting plate 600 and the adhesive 650 are removed. Finally, as shown in FIG. 3O, the metal plate 500 is removed using etching. It is noted that, since the etching liquid for the stopping layer 550 which is made of nickel, tungsten, or nickel-tungsten alloy is different from the etching liquid for copper. Therefore, in this embodiment, the stopping layer 550 is provided as the etching-stopping layer, and the copper in the holes 510 is retained, the copper protrudes out of the first resin layer 20 and may be provided as probes 11 (as the copper core layer 111), and the stopping layer 550 is provided as the outer layer 113 for protecting the copper core layer 111. Moreover, portions of the stopping layer 550 which are enclosed by the first resin layer 20 are provided as the connection base 115. Accordingly, in one or some embodiments, because the mechanical strength of the metal plate 500 is stronger than the mechanical strength of the photoresist, and the metal plate 500 is not deformed easily, the holes 510 of the metal plate 500 can directly define the length and the diameter of the probes 11, thereby facilitating the specification of the probes 11 to be uniformized and standardized.

In brief, according to one or some embodiments, the metal plate 500 is provided as a mold for manufacturing the probes 11. Moreover, image transfer techniques for manufacturing circuit boards are utilized in the manufacturing processes, so that the probes 11 extend along the same direction and thus are not configured obliquely or bent. Moreover, according to one or some embodiments, the polishing technique is not necessarily required and the resin inside the test fixture 1 is not damaged in which the metal wires will be squeezed and damaged. Accordingly, the product yield of the test fixture can be increased and the manufacturing cost of the test fixture can be reduced.

Although the instant disclosure has been disclosed as above by way of embodiments, the embodiments are not intended to limit the scope of the instant disclosure, and persons having ordinary skills in the art may make some changes and modifications without departing from the spirit and scope of the instant disclosure, and therefore the scope of protection of the instant disclosure shall be subject to the scope of the instant disclosure as defined in the appended claims.

What is claimed is:

1. A test fixture comprising:

a probe layer comprising a plurality of probes, wherein the probes are arranged equidistantly in a first direction and extend in a second direction, the first direction is substantially perpendicular to the second direction, each of the probes comprises a copper core layer and an outer layer, and the outer layer encloses an outer surface of the copper core layer, and the outer layer comprises nickel;

a first resin layer on the probe layer, wherein the first resin layer has a plurality of first openings, and the first openings correspond to the probes;

a first circuit layer on at least one portion of the first resin layer and in the first openings, wherein the first circuit layer is connected to the probe layer;

a second resin layer on the first circuit layer and the first resin layer, wherein the second resin layer has a plurality of second openings;

a second circuit layer on at least one portion of the second resin layer and in the second openings, wherein the second circuit layer is electrically connected to the first circuit layer;

a solder mask layer on the second circuit layer and the second resin layer, wherein the solder mask layer has a plurality of bonding pad openings; and a bonding pad layer comprising a plurality of bonding pads, wherein the bonding pads are in the bonding pad openings and protrude out of the solder mask layer, the bonding pad layer is electrically connected to the second circuit layer, and a first pitch between the bonding pads is greater than a second pitch between the probes, wherein the first pitch is in a range between 0.3 mm and 10 mm, and the second pitch is in a range between 0.1 mm and 1 mm.

2. The test fixture according to claim 1 further comprising a third resin layer and a redistribution circuit layer, wherein the third resin layer is on the second circuit layer and the second resin layer, the third resin layer has a plurality of third openings, the redistribution circuit layer is on at least one portion of the third resin layer and in the third openings, and the redistribution circuit layer is connected to the second circuit layer and the bonding pad layer.

3. The test fixture according to claim 2, wherein a pitch between the third openings is not identical to a pitch between the second openings.

4. The test fixture according to claim 1, wherein a pitch between the first openings is not identical to a pitch between the second openings.

5. The test fixture according to claim 1, wherein a length of each of the probes is in a range between 0.03 mm and 0.5 mm.

6. The test fixture according to claim 1, wherein the outer layer further comprises tungsten or comprises tungsten-nickel alloy.

7. The test fixture according to claim 1, wherein each of the probes further comprises a connection base, the connection base is connected to the copper core layer and the first circuit layer, and an area of the connection base is greater than an area of the copper core layer.

* * * * *